(12) United States Patent
Bangsaruntip et al.

(10) Patent No.: US 8,680,510 B2
(45) Date of Patent: Mar. 25, 2014

(54) METHOD OF FORMING COMPOUND SEMICONDUCTOR

(75) Inventors: Sarunya Bangsaruntip, Mount Kisco, NY (US); Mikael Bjoerk, Affoltern am Albis (CH); Guy M. Cohen, Mohegan Lake, NY (US); Heike E. Riel, Baech (CH); Heinz Schmid, Waedenswil (CH)

(73) Assignee: International Business Machines Corporation, Armonk, NY (US)

( * ) Notice: Subject to any disclaimer, the term of this patent is extended or adjusted under 35 U.S.C. 154(b) by 638 days.

(21) Appl. No.: 12/824,288

(22) Filed: Jun. 28, 2010

(65) Prior Publication Data

US 2011/0315953 A1 Dec. 29, 2011

(51) Int. Cl.
*H01L 29/12* (2006.01)
*H01L 33/02* (2010.01)

(52) U.S. Cl.
USPC ............ 257/24; 257/13; 257/14; 257/E21.09; 257/E21.404; 438/197

(58) Field of Classification Search
USPC .............................. 977/763, 762; 117/87, 105
See application file for complete search history.

(56) References Cited

U.S. PATENT DOCUMENTS

| | | | |
|---|---|---|---|
| 5,352,512 A * | 10/1994 | Hoffman | 428/311.51 |
| 7,361,522 B2 | 4/2008 | Wang et al. | |
| 7,560,366 B1 * | 7/2009 | Romano et al. | 438/503 |
| 7,834,264 B2 * | 11/2010 | Majumdar et al. | 136/230 |
| 7,871,870 B2 * | 1/2011 | Mostarshed et al. | 438/151 |
| 7,898,005 B2 * | 3/2011 | Yang et al. | 257/200 |
| 8,038,795 B2 * | 10/2011 | Barker et al. | 117/87 |
| 2003/0008505 A1 * | 1/2003 | Chen et al. | 438/689 |
| 2004/0175844 A1 * | 9/2004 | Yang et al. | 438/2 |
| 2004/0235016 A1 * | 11/2004 | Hamers et al. | 435/6 |
| 2004/0262636 A1 * | 12/2004 | Yang et al. | 257/200 |
| 2005/0056118 A1 * | 3/2005 | Xia et al. | 75/330 |
| 2005/0064185 A1 * | 3/2005 | Buretea et al. | 428/364 |
| 2005/0121706 A1 * | 6/2005 | Chen et al. | 257/288 |
| 2005/0133476 A1 * | 6/2005 | Islam et al. | 216/2 |
| 2006/0019472 A1 * | 1/2006 | Pan et al. | 438/486 |
| 2007/0122313 A1 * | 5/2007 | Li et al. | 422/100 |
| 2007/0278574 A1 | 12/2007 | Hsu et al. | |
| 2008/0014689 A1 * | 1/2008 | Cleavelin et al. | 438/197 |
| 2008/0038521 A1 * | 2/2008 | Robbins | 428/209 |
| 2008/0072818 A1 * | 3/2008 | Mostarshed et al. | 117/87 |
| 2008/0088899 A1 * | 4/2008 | Kamins et al. | 359/196 |
| 2008/0251862 A1 * | 10/2008 | Fonash et al. | 257/408 |
| 2009/0098714 A1 | 4/2009 | Chang et al. | |
| 2009/0111250 A1 | 4/2009 | Lee et al. | |
| 2009/0159996 A1 * | 6/2009 | Chow et al. | 257/415 |
| 2009/0269909 A1 | 10/2009 | Kim et al. | |

(Continued)

FOREIGN PATENT DOCUMENTS

| | | | |
|---|---|---|---|
| WO | WO0159821 A1 | 8/2001 | |
| WO | WO2009007907 A2 | 1/2009 | |

*Primary Examiner* — Cheung Lee
*Assistant Examiner* — William Harriston
(74) *Attorney, Agent, or Firm* — Cantor Colburn LLP; Daniel Morris (57) ABSTRACT

A method of forming a semiconductor is provided and includes patterning a pad and a nanowire onto a wafer, the nanowire being substantially perpendicular with a pad sidewall and substantially parallel with a wafer surface and epitaxially growing on an outer surface of the nanowire a secondary layer of semiconductor material, which is lattice mismatched with respect to a material of the nanowire and substantially free of defects.

24 Claims, 7 Drawing Sheets

(56) References Cited

U.S. PATENT DOCUMENTS

| | | |
|---|---|---|
| 2009/0278125 A1 | 11/2009 | Duan et al. |
| 2010/0203712 A1* | 8/2010 | Coronel et al. ............... 438/479 |
| 2010/0276662 A1* | 11/2010 | Colinge ............................ 257/9 |
| 2010/0295020 A1* | 11/2010 | Barwicz et al. ................. 257/24 |
| 2010/0323500 A1* | 12/2010 | Buretea et al. ................. 438/478 |
| 2010/0327258 A1* | 12/2010 | Lee et al. ........................ 257/14 |
| 2011/0133163 A1* | 6/2011 | Bangsaruntip et al. ......... 257/24 |
| 2011/0156003 A1* | 6/2011 | Taylor .............................. 257/14 |
| 2011/0186879 A1* | 8/2011 | Altebaeumer et al. .......... 257/89 |
| 2011/0193183 A1* | 8/2011 | Agarwal et al. ............... 257/414 |
| 2011/0223689 A1* | 9/2011 | Bailey ............................ 436/506 |

\* cited by examiner

METHOD OF FORMING COMPOUND SEMICONDUCTOR

BACKGROUND

Aspects of the present invention are directed to methods of forming compound semiconductors and, more particularly, methods of forming compound semiconductors on silicon.

Silicon is the second most abundant element on earth and therefore also the cheapest choice for the semiconductor industry. As such, the entire electronics industry is largely dependent on silicon for various applications although, in some, it would actually be preferable to use other materials, such as III/V or II/VI semiconductor materials. III/V or II/VI semiconductor materials often offer superior properties and device performance as compared to silicon and so are better suited for use in certain types of devices. For example, light emitting devices, such as lasers diodes, use a direct bandgap semiconductor and are, therefore, commercially fabricated using gallium arsenide (GaAs) or indium phosphide (InP). Silicon has an indirect bandgap and is, therefore, not suited for lasers. Unfortunately, these III/V or II/VI materials are often very expensive and rare. Indeed, a 2" sample of silicon may cost approximately 10 EUR whereas a 2" sample of a III/V semiconductor, such as gallium arsenide (GaAs) or indium arsenide (InAs), may cost approximately 100-400 EUR.

As a solution to the problem of cost and material availability, there have been many attempts at growing, for example, III/V semiconductor materials on top of silicon wafers to build large scale wafers of silicon and III/V semiconductor materials. These methods often rely on thick buffer layers, such as thick defective layers, which are in their own right expensive, to relax the lattice mismatch between silicon and the III/V semiconductor material. Even with such buffer layers, typically, several micrometers of different III/V semiconductor materials must be grown before enough defects (mainly misfit dislocations) nucleate to effectively relax the films.

Attempts to mitigate these problems have previously relied on trapping dislocations by forming trenches in the silicon, in which other semiconductor materials are made to grow, whereby defects or dislocations get trapped as they hit the trench sidewalls. Here, a further issue is that, as the trenches are overgrown, still new defects form as additional films form on top of the trench walls.

SUMMARY

In accordance with an aspect of the invention, a method of forming a semiconductor is provided and includes patterning a pad and a nanowire onto a wafer, the nanowire being substantially perpendicular with a pad sidewall and substantially parallel with a wafer surface and epitaxially growing on an outer surface of the nanowire a secondary layer of semiconductor material, which is lattice mismatched with respect to a material of the nanowire and substantially free of defects.

In accordance with an aspect of the invention, a method of forming a compound semiconductor on silicon is provided and includes patterning a pad and a nanowire onto a wafer, the nanowire being substantially perpendicular with a pad sidewall and substantially parallel with a wafer surface and epitaxially growing on an outer surface of the nanowire a secondary layer of semiconductor material, which is lattice mismatched with respect to a material of the nanowire, the semiconductor material being substantially free of defects and extending substantially around a circumference and along a length of the nanowire.

In accordance with an aspect of the invention, a method of forming a compound semiconductor on silicon is provided and includes patterning a pad and a nanowire onto a wafer, the nanowire being substantially perpendicular with a pad sidewall and substantially parallel with a wafer surface and epitaxially embedding the nanowire within a secondary layer of semiconductor material, which is lattice mismatched with respect to a material of the nanowire, the semiconductor material being substantially free of defects and extending substantially around a circumference and along a length of the nanowire.

In accordance with an aspect of the invention, a method of forming a compound semiconductor on silicon is provided and includes patterning a pad and a nanowire onto a wafer, the nanowire being substantially perpendicular with a pad sidewall and substantially parallel with a wafer surface and epitaxially embedding the nanowire within a secondary layer of semiconductor material having a different size and geometry as compared to the nanowire, which is lattice mismatched with respect to a material of the nanowire, the semiconductor material being substantially free of defects and extending substantially around a circumference and along a length of the nanowire.

In accordance with an aspect of the invention, an apparatus is provided and includes a silicon wafer, a silicon-on-insulator (SOI) pad disposed on the wafer, a silicon nanowire coupled to a sidewall of the SOI pad and oriented substantially perpendicularly to the SOI pad sidewall and substantially in parallel with a top surface of the wafer and a secondary layer of semiconductor material, which is substantially free of defects and lattice mismatched with respect to a material of the nanowire, in which the nanowire is substantially entirely epitaxially embedded.

In accordance with an aspect of the invention, an apparatus is provided and includes a silicon wafer, a silicon-on-insulator (SOI) pad disposed on the wafer, a silicon nanowire coupled to a sidewall of the SOI pad and oriented substantially perpendicularly to the SOI pad sidewall and substantially in parallel with a top surface of the wafer and a secondary layer having a different size and geometry from the nanowire of semiconductor material, which is substantially free of defects and lattice mismatched with respect to a material of the nanowire, in which the nanowire is substantially entirely epitaxially embedded.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

FIGS. 3A, 3B, 3C, 3D, 3E and 3F illustrate a method of forming the compound semiconductor surrounding the nanowire of FIG. 1 where FIGS. 3A, 3C and 3E show top-down views while FIGS. 3B, 3D and 3F show cross-sectional views corresponding to FIGS. 3A, 3C and 3E;

DETAILED DESCRIPTION

Semiconductor materials are insulators at absolute zero that provide a limited degree of electrical conductivity at room temperatures, which can be controlled by the addition of impurities that alter electronic properties. As mentioned above, silicon (Si) is a common and relatively inexpensive type of semiconductor. Other semiconductors, including but not limited to group IV semiconductors, group II/VI semiconductors and group III/V semiconductors, are relatively expensive and provide properties that make them useful for particular applications as compared to silicon.

For example, a III/V compound semiconductor, such as gallium arsenide (GaAs), may have six times higher electron mobility than silicon. As such, the use of gallium arsenide in a device allows for faster operations than silicon. Gallium arsenide has a wider bandgap than silicon (1.42 eV vs. 1.1 eV at 300K), which allows for a higher temperatures operation of devices. Gallium arsenide also has a direct bandgap, making it more suitable for opto electronic applications than the indirect bandgap of silicon. Gallium arsenide can also be alloyed to ternary and quaternary compositions, with further adjustable band gap width, allowing for light emission at chosen wavelengths.

While gallium arsenide lasers are mostly used in applications such as CD and DVD players, and for short distance optical communication, still other compound semiconductor materials, such as indium phosphide (InP) and its alloys (e.g., InGaAsP), are used to make lasers that are used in fiber optic communication, which could not be fabricated from silicon. Both gallium arsenide and indium phosphide can be fabricated in a semi-insulating form, which is needed to minimize substrate losses in microwave applications.

Some semiconductor materials can be prepared with tunable properties, e.g., a specific bandgap or lattice constant, by alloying multiple compound semiconductors, resulting in ternary, quaternary, or even quinary compositions. Ternary compositions allow for adjusting of the band gap within the range of the involved binary compounds. However, in the case of combinations of direct and indirect band gap materials, there is a ratio where indirect band gap prevails, limiting the range usable for optoelectronics. Lattice constants of the compounds also tend to be different, and the lattice mismatch against the substrate, dependent on the mixing ratio, causes defects in amounts dependent on the mismatch magnitude. This influences the ratio of achievable radiative/nonradiative recombinations and determines the luminous efficiency of associated devices. Quaternary and higher compositions further allow for simultaneous adjustments of the band gap and the lattice constant, allowing for increasing radiant efficiency at wider ranges of wavelengths.

For example, the ternary aluminum gallium arsenide ($Al_xGa_{1-x}As$) compositions can be epitaxially grown over GaAs. The growth of aluminum gallium arsenide compositions is nearly latticed matched to GaAs for the full range of $0<x<1$. In yet another example, the ternary aluminum gallium arsenide compositions are only latticed matched to indium phosphide (InP) when $x=0.47$.

Figure 1:
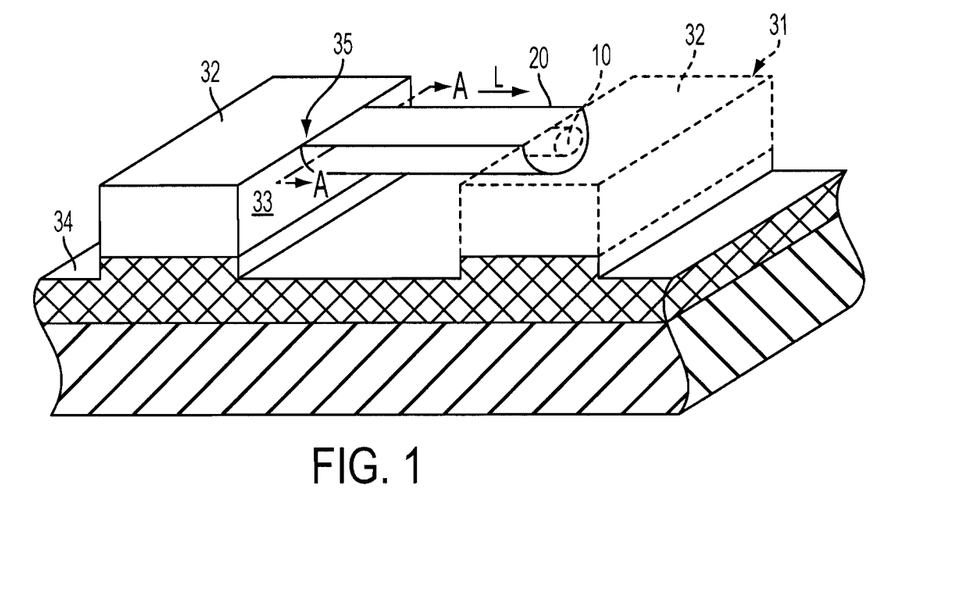
FIG. 1 is a perspective view of a compound semiconductor surrounding a silicon nanowire in accordance with embodiments of the invention.
Figure 2:
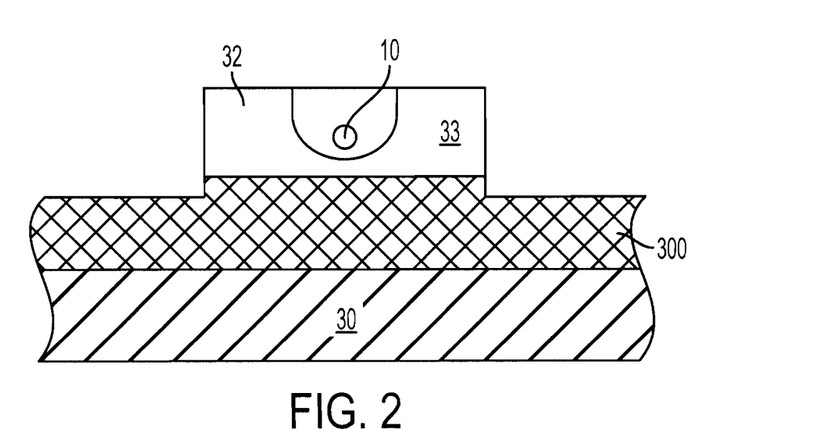
FIG. 2 is an cross-sectional view of the compound semiconductor surrounding the nanowire of FIG. 1 along line A-A.

With reference to FIGS. 1 and 2 and, in accordance with aspects of the invention, a silicon nanowire 10 is formed from a wafer 30, such as an SOI wafer with a buried oxide (BOX) layer 300, where a top silicon layer 31 is patterned by lithography and etching to form the silicon nanowire 10 in between relatively large pads 32. The silicon nanowires 10 are oriented to be substantially perpendicular with respect to sidewalls 33 of the pads 32 and substantially parallel with a top surface 34 of the buried oxide layer 300 of the wafer 30. The silicon nanowires 10 can be further shaped and thinned beyond the dimensions at which they can be fabricated by additional lithography and etching. This can be achieved by processes such as, for example, thermal oxidation, etching and hydrogen annealing at elevated temperatures. Ultimately, the silicon nanowires 10 may have any one or more of substantially circular, ovoid, square, hexagonal and octagonal cross-sections.

In addition, semiconductor material 20, which is selected from exemplary semiconductor materials groups IV, III/V, II/VI and IV/VI or other similar groups, may be epitaxially grown directly on the silicon nanowire 10. This epitaxial growth does not require relatively thick, expensive buffers since both radial and longitudinal strain associated with the epitaxial growth is relaxed relatively efficiently. In addition, since the silicon nanowires 10 are substantially parallel with the top surface 34 of the wafer 30, the approach may allow for the development of devices relying upon planarization of the semiconductor material 20, as will be described below.

Thus, in accordance with aspects of the invention, the silicon nanowire 10 or a set of silicon nanowires 10 may be employed as a platform or template on which another semiconductor material, such as semiconductor material 20, may be epitaxially grown even where the semiconductor material 20 is lattice mismatched with respect to the silicon of the silicon nanowire 10. The epitaxial growth is achieved by, for example, a film deposition process in which the arrangement of the atoms of semiconductor material 20 mimics the arrangement of the silicon atoms of the silicon nanowire 10. In the following discussion we will assume that semiconductor material 20 has a different lattice constant than that of the semiconductor of the silicon nanowires 10.

If a silicon nanowire 10 was substantially thicker than a film of semiconductor material 20, then, at least initially, the film of the semiconductor material 20 will be deposited by a matching of an in-plane lattice constant of the semiconductor material 20 to that of the silicon nanowire 10 with an out-of-plane lattice constant being different based on the Poisson ratio. The out-of-plane distortion of the lattice constant of the film of the semiconductor material 20 leads to the film of the semiconductor material 20 being strained. As the deposition of the film of the semiconductor material 20 continues, it reaches a critical film thickness where the accumulated strain energy is so high that it is more energetically favorable to form a defect, such as a dislocation. The formation of these dislocations leads to strain relief.

When a silicon nanowire 10 has a thickness that is smaller or comparable to the thickness of the film of the semiconductor material 20, the silicon nanowire 10 no longer sets the lattice constant to which the film of the semiconductor material 20 has to accommodate. In this case, the growth of the film of the semiconductor material 20 also induces strain in the silicon nanowire 10 with opposite polarity to strain in the secondary layer of semiconductor material 20, which, due to the small diameter of the silicon nanowire 10, becomes compliant so that strain sharing occurs. For example, if the film of the semiconductor material 20 develops tensile strain, then the silicon nanowire 10 will have compressive strain. The total strain in the system is therefore reduced by the compliance of the silicon nanowire 10, which, therefore, delays the formation of defects for strain relief.

Thus, defect avoidance is at least partially attributable to the radial and axial relaxation of both the semiconductor material 20 and the silicon nanowire 10. This radial and axial relaxation is made possible by the relatively small cross-sections of the silicon nanowires 10, which are formed to be below about 30 nm and, in some cases, about 3 nm or even smaller, with about 250 nm exemplary longitudinal lengths. With the silicon nanowires 10 formed with such small dimensions, radial and axial strain induced by lattice mismatch between the silicon of the silicon nanowire 10 and the semiconductor material 20 is relaxed and epitaxial growth of the semiconductor material 20 lattice on the silicon nanowire 10 lattice may occur in radial and axial directions relatively efficiently without forming a substantial number of defects.

Indeed, relatively thin silicon nanowires 10 accommodate large radial strains ($\Delta r/r$) of about 7% with similarly large longitudinal strains ($\Delta l/l$) also accommodated. While the degree of longitudinal strain that can be accommodated is generally less than that of the radial strain, larger longitudinal strain can be accommodated by de-clamping one side of the silicon nanowire 10 to thereby permit free longitudinal expansion. That is, because the silicon nanowire 10 is clamped in between two SOI pads 32 it may be relatively difficult for the system to permit elastic relaxation (i.e. relaxation without formation of defects) of longitudinal strain along the silicon nanowire 10 during the epitaxial growth of the semiconductor material 20. In addition, where the semiconductor material 20 is a III/V semiconductor material, the degree of the lattice mismatch may be relatively large. In either or both of these instances, one end of the silicon nanowires 10 may be released or de-clamped from one of the SOI pads 32 during the epitaxial growth and, as a result, relatively free longitudinal expansion of the silicon nanowires 10 in the direction, L, can occur.

In a more general form, as long as silicon nanowire 10 is held at a single point, elastic longitudinal relaxation is facilitated. Moreover, if silicon nanowire 10 is severed at any point between pads 32, forming two separate cantilevers, each of the cantilevers (nanowires parts) would be free-standing as they are held only at one point where they connect to pads 32. When epitaxial growth of semiconductor material 20 takes place, each silicon nanowire 10 cantilever is free to expand (or contract) to accommodate the lattice mismatched between the nanowire material and the semiconductor material 20.

With reference to FIGS. 3A-3F, epitaxial growth of semiconductor material 20 may be achieved on a silicon nanowire 10 in a shell/film formation or another similar formation, such as a partial film layer formation, without a substantial number of defects and/or anti-phase domains (APDs) formed due to the relatively small radial and axial size of the silicon nanowire 10.

Figure 3A:
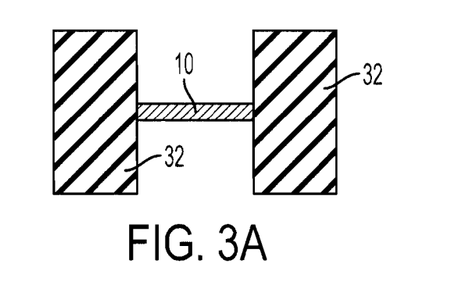
Figure 3B:
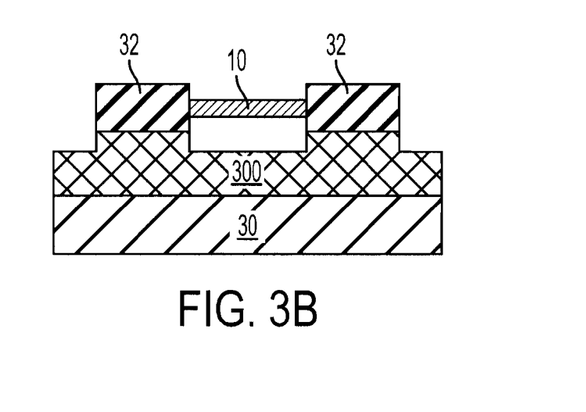
Figure 3C:
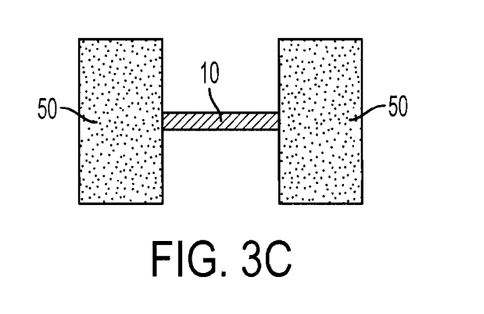
Figure 3D:
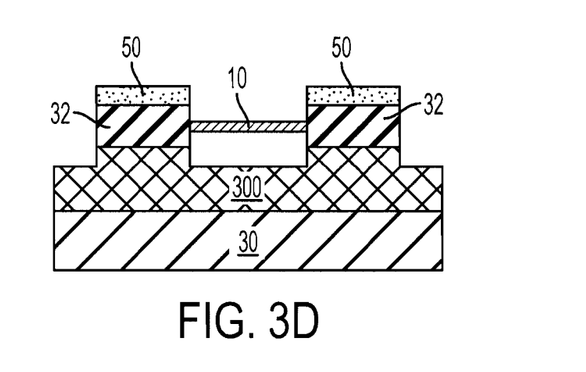

This is shown, initially, in FIGS. 3A (top-down view) and 3B (side-view), in which the silicon nanowire 10 is suspended over the buried oxide layer 300 of wafer 30 between SOI pads 32 such that the silicon nanowire 10 is parallel with a top surface of the wafer 30 and perpendicular to the sidewalls of the SOI pads 32. At this point, as shown in FIGS. 3C and 3D, the SOI pads 32 may be covered with a hard mask 50. The hard mask 50 prevents epitaxial growth at the SOI pads 32 and thereby avoids the generation of defects that would be associated with epitaxial growth of semiconductor material 20 on surfaces of the SOI pad 32, which are relatively large as compared to the silicon nanowire 10 and therefore relatively incapable of strain relaxation. The avoidance of such defect generation is important since the defects otherwise formed on the surfaces would tend to propagate to the silicon nanowire 10.

Figure 3E:
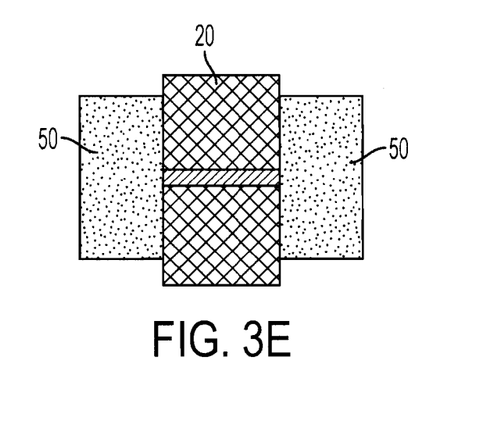
Figure 3F:
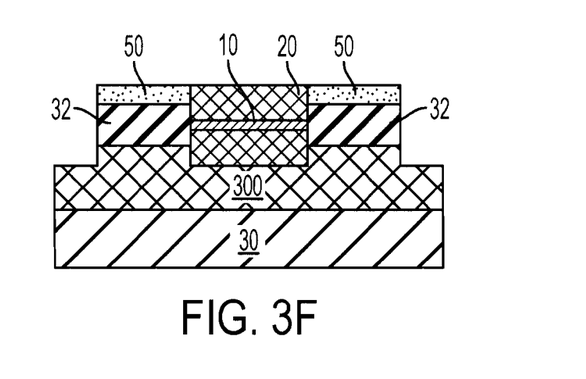

Finally, as shown in FIGS. 3E and 3F, semiconductor material 20, such as III/V semiconductor material, is epitaxially grown on the entire silicon nanowire 10 or only a portions thereof to have a different size and/or a different geometry from that of the silicon nanowire 10. Indeed, in some cases, the semiconductor material 20 will have a lateral length and a height which are different from those of the SOI pads 32 as well. Here, chemical mechanical polishing (CMP) and/or other similar process may be employed to form a smooth surface 35 (see FIGS. 1 and 2) for the semiconductor material 20.

The hard mask 50 is chosen as a CMP stop layer. The CMP slurry and pad are chosen to remove semiconductor material 20, but to have a negligible removal rate of the hard mask 50. As a result, when the polished semiconductor material 20 levels with the top surface of hard mask 50 (the CMP stop layer), the removal of additional material form the top surface of semiconductor material 20 stops. The reason is that the CMP pad lands on the hard mask 50, which was chosen to have a very low polish rate, preventing further polishing. In addition to good planarization of the wafer surface the process allows accurate control of the thickness of the epitaxial semiconductor material 20 film.

Figure 4:
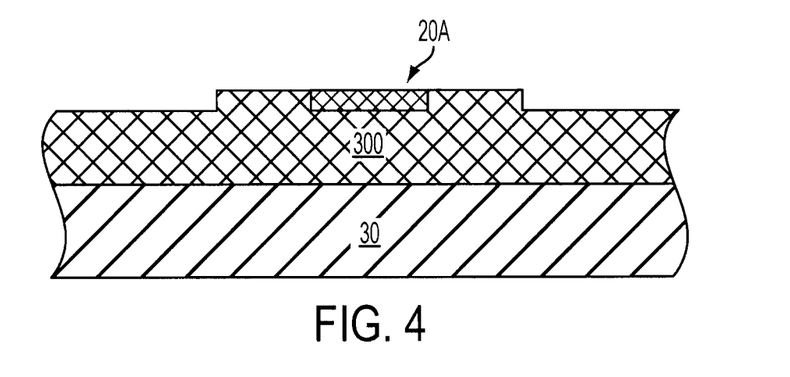
FIG. 4 is a plan view of a structure that may be formed by way of the method illustrated in FIGS. 3A, 3B, 3C, 3D, 3E and 3F.

FIG. 4 illustrates another embodiment in which a final structure includes islands 20A of semiconductor material 20 formed as described above that are embedded in buried oxide 300. That is, following the growth of semiconductor material 20 that templates off of the silicon nanowire 10, CMP is applied. The CMP process fully polishes the SOI pads 32 and the silicon nanowire 10 until the CMP polish pad lands on the buried oxide layer 300 under the SOI pads 32. The CMP slurry that is used in this process is chosen to have a very low removal rate for buried oxide 300 material, so the CMP nearly stops once the SOI pads 32 are removed. This process leaves the islands 20A of epitaxial semiconductor material 20 embedded in buried oxide 300. Thus, this process results in isolated islands 20A of semiconductor material 20 and allows for a circuit layout where the active devices are made in regions of the islands 20A while interconnects are fabricated over the oxide to reduce parasitic capacitance.

Figure 5:
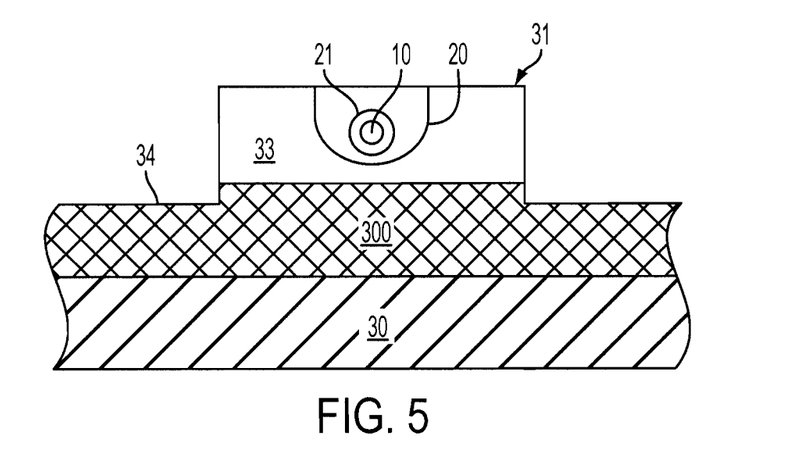
FIG. 5 is a cross-sectional view of a nanowire in accordance with further embodiments of the invention.

Epitaxial growth may also be conducted to form multiple layers of different semiconductor materials and/or dopings with the relatively small diameter and length of the silicon nanowires 10 allowing for substantial stress relaxation from the lattice mismatch of adjacent layers. That is, with reference to FIG. 5, one or more of IV/VI and II/VI semiconductor materials may be epitaxially grown on an outer surface of the silicon nanowire 10 and one or more of III/V and II/VI semiconductor materials may then be grown on an outer surface of the epitaxially grown IV/VI and/or II/VI semiconductor materials. As an example to possibly reduce strains further, a shell of another semiconductor material 21, such as a germanium or silicon germanium shell, may be epitaxially grown around the silicon nanowire 10 to relax some of the strain that will be experienced by at least the silicon nanowire 10. Then, a more highly lattice mismatched semiconductor material 20 can be epitaxially grown on the shell of another semiconductor material 21. Here, strain is reduced in steps so that materials with a lattice mismatch with silicon as high as ~11% can be epitaxially grown without the generation of a substantial number of defects.

Figure 6A:
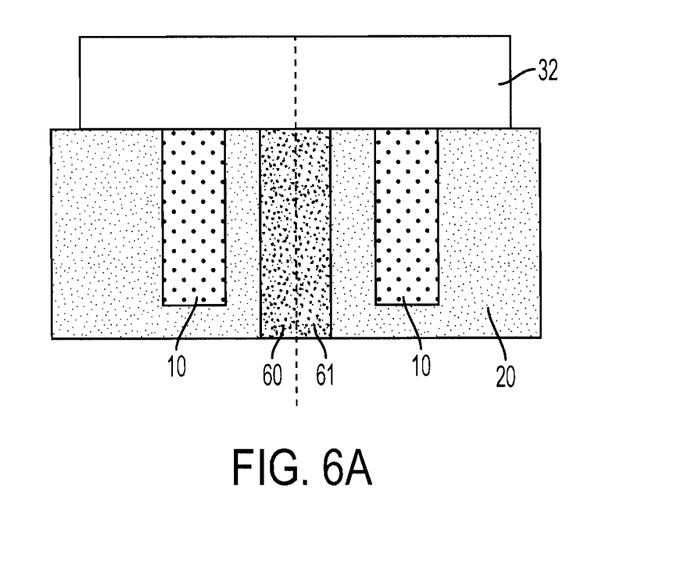
FIG. 6A is a top view of adjacent nanowire structures.
Figure 6B:
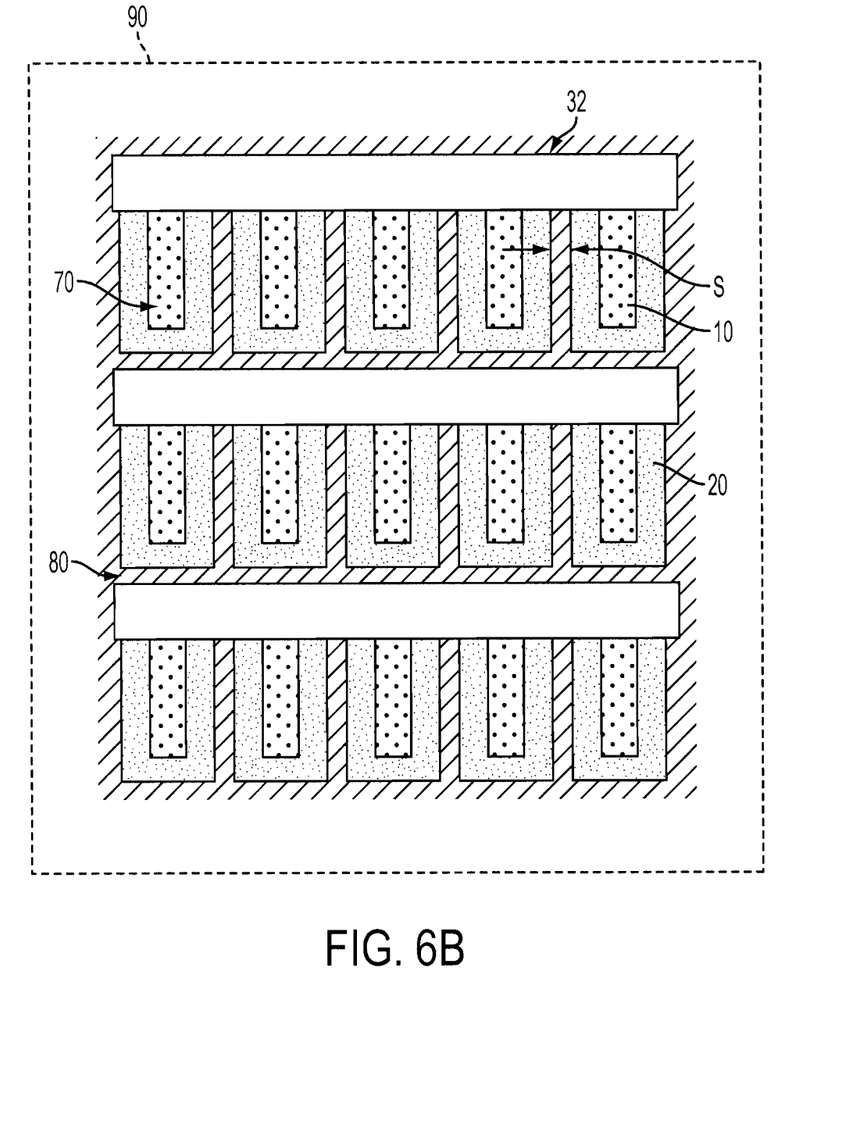
FIG. 6B is a top view of an array of nanowire structures in accordance with embodiments of the invention.

With reference now to FIGS. 6A and 6B, as still another method of avoiding defects, single silicon nanowires 10 may be employed as templates to avoid coalescence of two growth fronts 60, 61 in semiconductor material 20 seeded from nearby silicon nanowires 10. At such interfaces, defects will tend to nucleate and, as such, they may be avoided. Therefore, as shown in FIG. 6B, arrays 70 of silicon nanowires 10 with semiconductor material 20 epitaxially grown thereon should be formed with the silicon nanowires 10 spaced apart sufficiently far enough so that the growth fronts 60, 61 (see FIG. 6A) do not merge. The resulting space, S, can then be filled in with an insulating material 80 and the entire SOI wafer 30 can be polished to accomplish a planar wafer 90 with regions/inclusions of semiconductor material 20. Thus, each area, the size of which is determined by the spacing of seed silicon nanowires 10 and the epitaxial growth duration, can be used for single or multiple components employing the semiconductor material 20.

An additional variation relies on multiple growths of differing semiconductor materials where specific regions are coated and other regions, where growth is not desired, are covered. In this way, an arbitrary pattern can be created over the wafer 30. For instance, in complementary-metal-oxide-semiconductor (CMOS) technology, it may be desirable to have germanium regions next to indium gallium arsenide (InGaAs) regions for p- and n-type FETs, respectively, to replace the conventional silicon CMOS at the end of the silicon roadmap.

Figure 7:
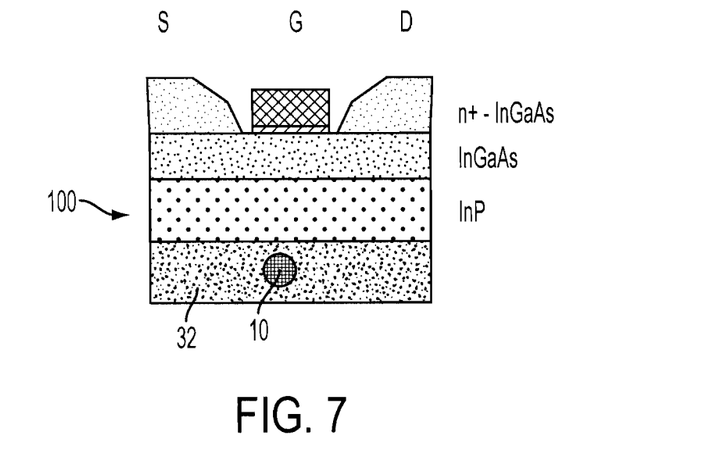
FIG. 7 is an exemplary MOSFET device in accordance with embodiments of the invention.

With reference to FIG. 7, an exemplary III/V metal-oxide-semiconductor field-effect transistor (MOSFET) device may be formed in accordance with the description provided above. As shown in FIG. 7, a III/V semiconductor material, such as indium phosphide (InP), may be epitaxially grown without a substantial number of defects on silicon nanowire 10, which is formed with the dimensions discussed above, and which is clamped onto SOI pad 32 in a manner similar to the discussion above. Sequential layers of indium gallium arsenide (InGaAs) and n-doped indium gallium arsenide (n-InGaAs), which is formed into source, gate and drain sections, can then be grown on the indium phosphide in a similar fashion without generation of a substantial number of defects.

Figure 8:
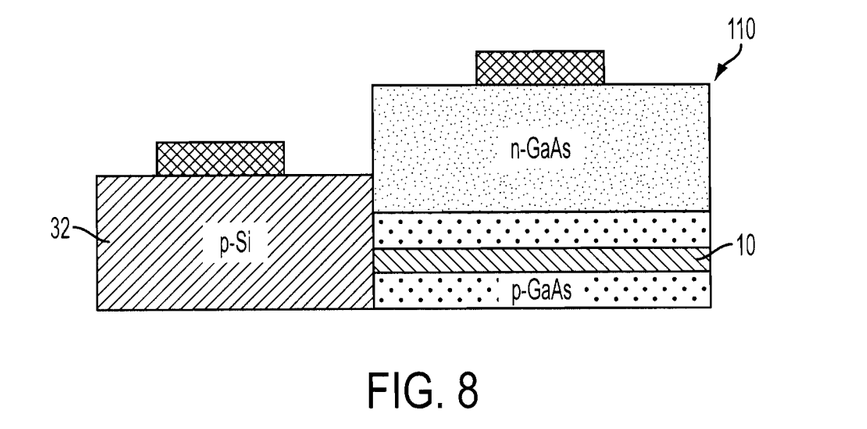
FIG. 8 is an exemplary light emitting diode in accordance with embodiments of the invention.

With reference to FIG. 8, an exemplary light emitting diode (LED) may be formed in accordance with the description provided above. As shown in FIG. 8, a III/V semiconductor material, such as p-doped gallium arsenide (p-GaAs), may be epitaxially grown without a substantial number of defects on silicon nanowire 10, which is formed with the dimensions discussed above, and which is clamped onto SOI pad 32 in a manner similar to the discussion above. Here, a layer of n-doped gallium arsenide (n-GaAs) 110 can then be grown on the p-doped gallium arsenide in a similar fashion without generation of a substantial number of defects.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. A method of forming a semiconductor, the method comprising:
   patterning a pad and a nanowire onto a wafer, the nanowire being substantially perpendicular with a pad sidewall and substantially parallel with a wafer surface;
   epitaxially growing on an outer surface of the nanowire a secondary layer of semiconductor material, which is lattice mismatched with respect to a material of the nanowire and substantially free of defects; and
   de-clamping the nanowire from a second pad,
   wherein a lattice constant of the nanowire is modified by the secondary layer.

2. A method of forming semiconductor, the method comprising:
   patterning a pad and a nanowire onto a wafer, the nanowire being substantially perpendicular with a pad sidewall and substantially parallel with a wafer surface; and
   epitaxially growing on an outer surface of the nanowire a secondary layer of semiconductor material, which is lattice mismatched with respect to a material of the nanowire,
   the semiconductor material being substantially free of defects and extending substantially around a circumference and along a length of the nanowire, the method further comprising:
   de-clamping the nanowire from a second pad, wherein a lattice constant of the nanowire is modified by the secondary layer.

3. The method according to claim 2, further comprising reshaping the nanowire following the patterning such that the nanowire has one of a substantially circular, ovoid, square, hexagonal and octagonal cross-section.

4. The method according to claim 2, wherein a size of the secondary layer is greater in at least one dimension than the nanowire.

5. The method according to claim 2, further comprising disposing a mask onto the pad prior to the epitaxial growing operation.

6. The method according to claim 2, wherein the nanowire material comprises silicon and the semiconductor material of the secondary layer comprises one or more of IV, III/V, II-VI and IV/VI semiconductor materials.

7. The method according to claim 6, further comprising:
   epitaxially growing one or more of IV/VI and II/VI semiconductor materials on an outer surface of the nanowire; and
   epitaxially growing one or more of III/V and II/VI semiconductor materials on an outer surface of the epitaxially grown IV/VI and/or II/VI semiconductor materials.

8. The method according to claim 2, wherein the secondary layer relaxes elastically.

9. The method according to claim 2, wherein the nanowire is strained with opposite polarity to strain in the secondary layer.

10. The method according to claim 2, further comprising chemical mechanical polishing (CMP) to planarize the secondary layer.

11. The method according to claim 2, wherein the patterning comprises patterning multiple substantially parallel nanowires, the method further comprising:
   spacing the nanowires sufficient far apart such that secondary layers of each do not come into contact; and insulating the secondary layers of each of the multiple nanowires from one another.

12. The method according to claim 2, further comprising building a III/V metal-oxide-semiconductor field-effect transistor (MOSFET) onto the secondary layer.

13. The method according to claim 2, further comprising building a light emitting diode (LED) onto the secondary layer.

14. A method of forming semiconductor, the method comprising:
  patterning a pad and a nanowire onto a wafer, the nanowire being substantially perpendicular with a pad sidewall and substantially parallel with a wafer surface; and
  epitaxially growing on an outer surface of the nanowire a secondary layer of semiconductor material, which is lattice mismatched with respect to a material of the nanowire,
  the semiconductor material being substantially free of defects and extending substantially around a circumference and along a length of the nanowire, further comprising chemical mechanical polishing (CMP) to remove the pad and the nanowire to thereby leave an isolated planarized portion of the secondary layer intact.

15. A method of forming a semiconductor on silicon, the method comprising:
  patterning a pad and a nanowire onto a wafer, the nanowire being substantially perpendicular with a pad sidewall and substantially parallel with a wafer surface; and
  epitaxially embedding the nanowire within a secondary layer of semiconductor material, which is lattice mismatched with respect to a material of the nanowire,
  the semiconductor material being substantially free of defects and extending substantially around a circumference and along a length of the nanowire, the method further comprising de-clamping the nanowire from a second pad,
  wherein a lattice constant of the nanowire is modified by the secondary layer.

16. The method according to claim 15, wherein the epitaxially embedding of the nanowire within the secondary layer comprises one or more of forming the secondary layer to have a size differential compared to the nanowire and forming the secondary layer with a different geometry from that of the nanowire.

17. A method of forming a semiconductor on silicon, the method comprising:
  patterning a pad and a nanowire onto a wafer, the nanowire being substantially perpendicular with a pad sidewall and substantially parallel with a wafer surface; and
  epitaxially embedding the nanowire within a secondary layer of semiconductor material having a different size and geometry as compared to the nanowire, which is lattice mismatched with respect to a material of the nanowire,
  the semiconductor material being substantially free of defects and extending substantially around a circumference and along a length of the nanowire.

18. An apparatus, comprising a silicon wafer;
  a silicon-on-insulator (SOI) pad disposed on the wafer;
  a silicon nanowire coupled to a sidewall of the SOI pad and oriented substantially perpendicularly to the SOI pad sidewall and substantially in parallel with a top surface of the wafer; and
  a secondary layer of semiconductor material, which is substantially free of defects and lattice mismatched with respect to a material of the nanowire, in which the nanowire is substantially entirely epitaxially embedded,
  wherein respective top surfaces of the pad and the secondary layer are substantially coplanar and parallel with one another.

19. The apparatus according to claim 18, wherein a size of the secondary layer is greater in at least one dimension than the nanowire.

20. The apparatus according to claim 18, wherein the secondary layer comprises an inner shell of one or more of IV/VI and II/VI semiconductor materials and an outer shell of one or more of III/V and II/VI semiconductor materials.

21. The apparatus according to claim 18, wherein the nanowire and the secondary layer comprise correspondingly plural numbers of nanowires and secondary layers, the plural secondary layers being insulated from one another.

22. The apparatus according to claim 18, further comprising a III/V metal-oxide-semiconductor field-effect transistor (MOSFET) disposed on the secondary layer.

23. The apparatus according to claim 18, further comprising a light emitting diode (LED) disposed on the secondary layer.

24. An apparatus, comprising
  a silicon wafer;
  a silicon-on-insulator (SOI) pad disposed on the wafer;
  a silicon nanowire coupled to a sidewall of the SOI pad and oriented substantially perpendicularly to the SOI pad sidewall and substantially in parallel with a top surface of the wafer; and
  a secondary layer having a different size and geometry from the nanowire of semiconductor material, which is substantially free of defects and lattice mismatched with respect to a material of the nanowire, in which the nanowire is substantially entirely epitaxially embedded.

* * * * *